US011233031B2

(12) United States Patent
Arguelles et al.

(10) Patent No.: US 11,233,031 B2
(45) Date of Patent: Jan. 25, 2022

(54) FLIP-CHIP ON LEADFRAME HAVING PARTIALLY ETCHED LANDING SITES

(71) Applicant: Texas Instruments Incorporated, Dallas, TX (US)

(72) Inventors: Ronaldo Marasigan Arguelles, Baguio (PH); Edgar Dorotayo Balidoy, Benguet (PH); Gloria Bibal Manaois, Baguio (PH); Bernard Kaebin Andres Ancheta, Quirino (PH)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 431 days.

(21) Appl. No.: 14/964,248

(22) Filed: Dec. 9, 2015

(65) Prior Publication Data
US 2017/0170101 A1 Jun. 15, 2017

(51) Int. Cl.
*H01L 23/495* (2006.01)
*H01L 23/48* (2006.01)
(Continued)

(52) U.S. Cl.
CPC .......... *H01L 24/81* (2013.01); *H01L 23/3107* (2013.01); *H01L 23/49548* (2013.01); *H01L 23/49582* (2013.01); *H01L 24/13* (2013.01); *H01L 24/16* (2013.01); *H01L 24/17* (2013.01); *H01L 23/4951* (2013.01); *H01L 2224/13101* (2013.01); *H01L 2224/13111* (2013.01); *H01L 2224/13144* (2013.01); *H01L 2224/13147* (2013.01); *H01L 2224/16245* (2013.01); *H01L 2224/81011* (2013.01); *H01L 2224/81024* (2013.01); *H01L 2224/81026* (2013.01);
(Continued)

(58) Field of Classification Search
CPC ............ H01L 23/49541; H01L 21/565; H01L 23/3107; H01L 23/49582; H01L 24/81; H01L 24/17; H01L 2224/81026; H01L 2924/17747; H01L 2224/81191; H01L 2224/81815; H01L 2224/81024; H01L 2224/16245; H01L 23/49548; H01L 24/13; H01L 24/16
USPC ................ 257/676, 690, 778, 779, 780, 786
See application file for complete search history.

(56) References Cited

U.S. PATENT DOCUMENTS 6,482,680 B1 * 11/2002 Khor .................... H01L 23/3135
228/180.21
6,580,165 B1 6/2003 Singh
(Continued)

*Primary Examiner* — Kimberly N Rizkallah
*Assistant Examiner* — Dilinh P Nguyen
(74) *Attorney, Agent, or Firm* — Dawn Jos; Charles A. Brill; Frank D. Cimino

(57) ABSTRACT

A flip-chip on leadframe package includes a leadframe having a plurality of leads with each lead including an inner leadfinger portion, wherein at least a landing region of all of the inner leadfinger portions are in a single common level (or plane) and include etched areas providing bump pads having concave landing sites (landing sites). A semiconductor die (die) having an active top side surface with functional circuitry including bond pads has bumps or pillars thereon. An area of the landing sites is greater than an area of the bumps or pillars. A distal end of the bumps or pillars is within and electrically coupling to the landing sites. A mold material encapsulates the die and at least a portion of the inner leadfinger portions. The package can be a leaded package or a leadless package.

13 Claims, 7 Drawing Sheets

(51) Int. Cl.
*H01L 23/52* (2006.01)
*H01L 23/00* (2006.01)
*H01L 23/31* (2006.01)

(52) U.S. Cl.
CPC .............. *H01L 2224/81191* (2013.01); *H01L 2224/81385* (2013.01); *H01L 2224/81815* (2013.01); *H01L 2924/15747* (2013.01); *H01L 2924/181* (2013.01)

(56) References Cited

U.S. PATENT DOCUMENTS

| | | | |
|---|---|---|---|
| 7,443,015 B2 * | 10/2008 | Punzalan | H01L 23/49503 257/673 |
| 9,128,125 B2 * | 9/2015 | Jackson | G01R 19/0092 |
| 2002/0195720 A1 * | 12/2002 | Miyazaki | H01L 21/568 257/778 |
| 2006/0051894 A1 * | 3/2006 | Liu | B23K 3/0623 438/108 |
| 2007/0210438 A1 * | 9/2007 | Briere | H01L 23/3107 257/690 |
| 2012/0126429 A1 * | 5/2012 | Do | H01L 21/561 257/777 |
| 2014/0264846 A1 * | 9/2014 | Chen | H01L 21/76885 257/737 |

* cited by examiner

FLIP-CHIP ON LEADFRAME HAVING PARTIALLY ETCHED LANDING SITES

FIELD

Disclosed embodiments relate to flip-chip on leadframe semiconductor packages.

BACKGROUND

A variety of semiconductor chip packages are known that provide support for an integrated circuit chip (IC) or semiconductor die (die) and associated bond wires, provide protection from the environment, and enable surface mounting of the die to and interconnection with a printed circuit board (PCB). One conventional package configuration includes a leadframe having a die pad and wire bond pads.

Leadframe semiconductor packages are well known and widely used in the electronics industry to house, mount, and interconnect a variety of ICs. A conventional leadframe is typically die-stamped from a sheet of flat-stock metal, and includes a plurality of metal leads temporarily held together in a planar arrangement about a central region during package manufacture by a rectangular frame comprising a plurality of expendable "dam-bars." A mounting pad for a semiconductor die (die) is supported in the central region by "tie-bars" that attach to the frame. The leads extend from a first end integral with the frame to an opposite second end adjacent to, but spaced apart from, the die pad.

In a conventional flip-chip on leadframe package arrangement, in a placement step a die having solder bumps on its input/output (IO) or bond pads is flipped onto a lead frame including a die pad and/or a plurality leads including inner leadfingers sometimes called bondfingers. A solder bump reflow process follows resulting in the die being bonded to the die pad and the bumps on the bond pads being electrically coupled to the leadfingers. For flip-chip Small Outline Transistor (SOT) packages, the flip-chip die is mounted directly on the leadfingers with no die pad followed by a reflow.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize one significant problem for flip-chip on leadframe semiconductor packages results because the solder bumps on the semiconductor die (die) may not be well aligned to the intended landing site of the leads, and the alignment can further degrade due to additional movement during the solder reflow process. Disclosed embodiments partially etch a cavity in the inner leadfinger portions of the leads to provide bump pads having concave landing sites (landing sites). Such landing sites allow at least the distal end of the bumps or pillars on the bond pads of the die during die placement to enter the landing sites and be secured within, and to provide an electrical connection upon a subsequent reflow process.

Disclosed embodiments include a flip-chip on leadframe package including a leadframe having a plurality of leads with each lead including an inner leadfinger portion, wherein at least a landing region of all of the inner leadfinger portions are in a single common level (or plane) and include etched areas providing bump pads having disclosed landing sites. A semiconductor die (die) having an active top side surface with functional circuitry including bond pads has bumps or pillars thereon. An area of the landing sites is greater than an area of the bumps or pillars. A distal end of the bumps or pillars is within and electrically coupling to the landing sites. A mold material encapsulates the die and at least a portion of the inner leadfinger portions. The package can be a leaded package or a leadless package.

BRIEF DESCRIPTION OF THE DRAWINGS

Reference will now be made to the accompanying drawings, which are not necessarily drawn to scale, wherein.

DETAILED DESCRIPTION

Figure 1:
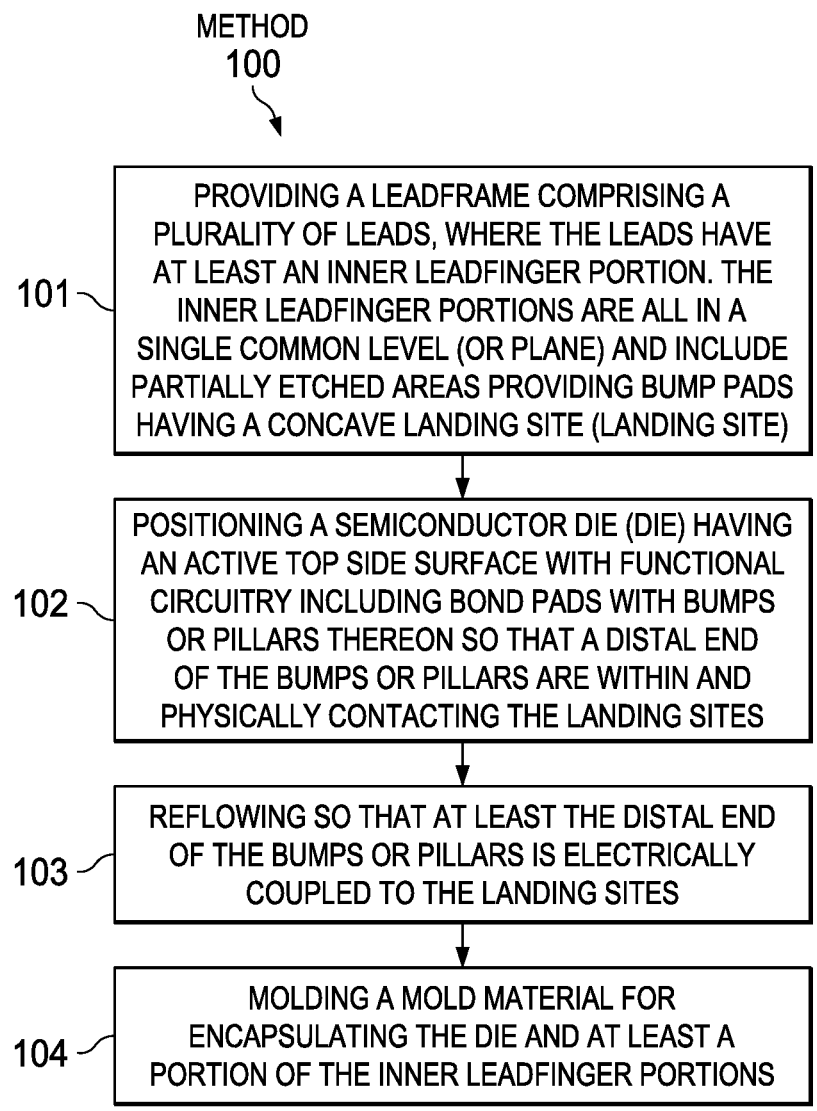
FIG. 1 is a flow chart that shows steps in an example method of assembling a flip-chip on leadframe package where the leads of the leadframe include inner leadfinger portions that are all in a single common level (or plane) including bump pads having disclosed landing sites, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a flow chart that shows steps in an example method 100 of assembling a flip-chip on leadframe package, according to an example embodiment. Step 101 comprises providing a leadframe generally in the form of a leadframe sheet comprising a plurality of physically interconnected leadframes. The leadframes generally comprise copper including copper or a copper alloy with optional plating. The leadframe can be a leaded leadframe including leads having an external lead portion and an inner leadfinger portion (or inner leadfingers, see FIG. 3 described below), or be a leadless leadframe (see FIGS. 4A and 4B described below) where the leads consist of only an inner leadfinger portion. At least a bonding region of the inner leadfinger portions of all the leads are in a single common level (or plane) and include partially-etched areas providing bump pads having disclosed landing sites.

The landing sites can be partially-etched areas that are 25% to 75% of the thickness of the full thickness regions of the leads, but can also be 5% to 95% of the thickness of the full thickness regions of the leads. Some example methods to form partially (e.g., half) etched landing sites include coining which comprises denting the inner leadfinger by a stamping apparatus, or by laser etching using a laser apparatus. The leadframe is generally exclusive of a die pad.

Step 102 comprises positioning a die having an active top side surface with functional circuitry including bond pads (input/output (I/O) pads) with bumps or pillars thereon so that a distal end of the bumps or pillars are within and physically contacting the landing sites. The functional circuitry is generally integrated circuitry that realizes and carries out desired functionality for the flip-chip on leadframe package, such as that of a digital IC (e.g., digital signal processor) or analog IC (e.g., amplifier or power converter), such as a BiMOS IC. The capability of functional circuitry provided by the flip-chip on leadframe package may vary, for example ranging from a simple device to a complex device. The specific functionality contained within functional circuitry is not of importance to disclosed embodiments.

Bumps can comprise solder bumps, and the pillars can comprise copper pillars or gold (Au) pillars, or the pillars can include bumps on their distal ends. The positioning can comprise having the leadframe stay flat on a pedestal, chuck, or other base which supports the leadframe in an upright position with the landing sites on a top surface, where the solder bumps/pillars of the die are then mounted onto the leadframe from above so that a distal end of the bumps or pillars are inserted within the landing sites. An area of the landing sites is greater than the area of the bumps or pillars, generally by a factor of 1.1 to 1.5.

Step 103 comprises reflowing so that at least the distal end of the bumps or pillars is electrically coupled (e.g., metallurgical bonded) to the landing sites. In one example, a solder bump reflow process uses a reflow peak temperature of about 255° C. for lead-free solder applications. Step 104 comprises molding a mold material for encapsulating the die and at least a portion of the inner leadfinger portions. In the typical case where the leadframe is part of a leadframe sheet, the method further includes singulating the leadframe sheet into a plurality of disclosed flip-chip on leadframe packages.

The leads can each include an external lead portion connected to the inner leadfinger portion extending out from the mold material to provide a leaded flip-chip on leadframe package (see FIG. 3 described below). For example, a small outline integrated circuit (SOIC), a small outline transistor (SOT), thin small outline package (TSOP) or other leaded flip-chip on leadframe package.

The leads can also consist of only an inner leadfinger portion, where a periphery of the inner leadfinger portions on a bottom of the package are exposed from the mold material to provide a flat no lead package such as a quad flatpack no leads (QFN) package (see FIGS. 4A and 4B described below). QFNs and small-outline no leads (SONs) are "leadless" packages with electrical connections made via perimeter lands (or leadless leads) exposed on the bottom side of the packaged device for connecting to the surface of a connecting substrate (e.g. printed circuit board (PCB)). This construction results in a cost-effective advanced packaging solution that helps to maximize board space with improved electrical and thermal performance over traditional leaded packages. While QFNs have solder lands on all four sides of the package, SONs typically have solder lands on only two sides of the package.

The landing sites can include an optional electroplated layer comprising a metal alloy that is compatible with a material of the distal end of the bumps or pillars. For example, one example compatible metal alloy is NiPdAu. "Compatible" as used herein refers to the solder cap in the pillar or bump being able to form a good metallurgical bond with the landing sites, so it may be possible that the landing sites can also be bare copper assuming the solder cap material can form a good bond with the bare copper landing. The landing sites can have various shapes, such as semi-circular, rectangular or a trapezoidal cross sectional shape (see FIG. 2H described below).

Figure 2A:
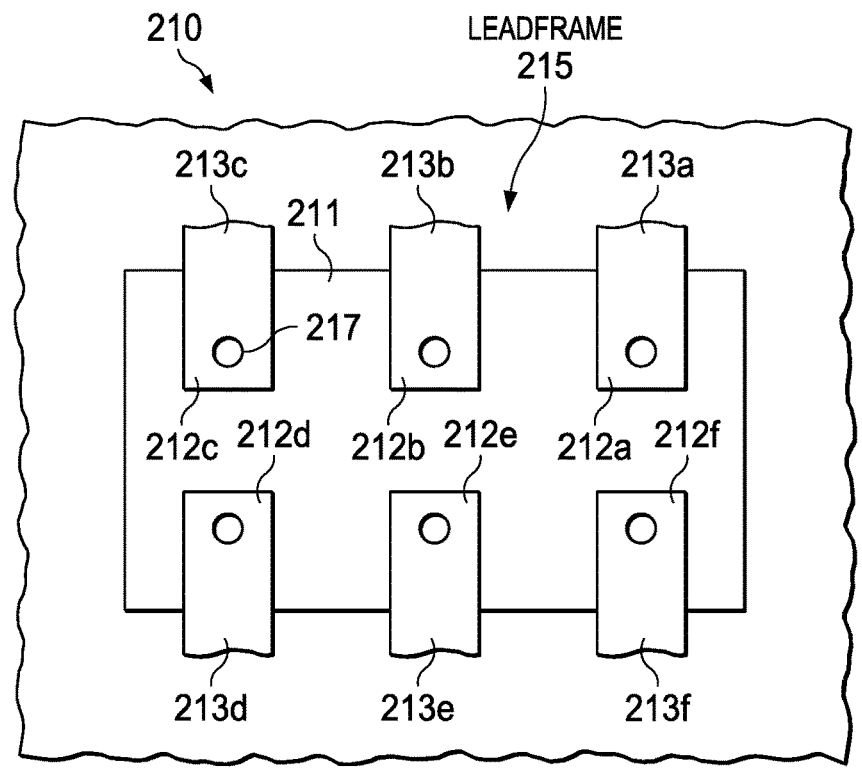
FIGS. 2A-H depict additional example simplified assembly details for an example leaded flip-chip on leadframe package assembly.

FIGS. 2A-H depict additional example simplified assembly details for an example leaded flip-chip on leadframe package assembly. FIG. 2A shows an example leadframe layout 210 showing a top view of a leadframe 215 including leads having external lead portions 213a-f and inner leadfinger portions 212a, 212b, 212c (collectively 212) each with partially-etched landing sites indicated as 217 shown as small circles. The bumps from the die (not shown) are later connected via a flip-chip die attach mounting process and then go on to a reflow process to create the metallurgical bond of the bumps or pillars to the material of the landing sites. The partially-etched (e.g., half-etched) landing sites (circles) of the internal leadfingers 212 correspond to the locations of the active bumps (or pillars) on the die. As noted above, these partially-etched landing sites may optionally be selectively plated (e.g., with NiPdAu). The rectangular box shown as 211 represents the mold material 211 with provides a plastic package outline for the package after molding/encapsulation.

Figure 2B:
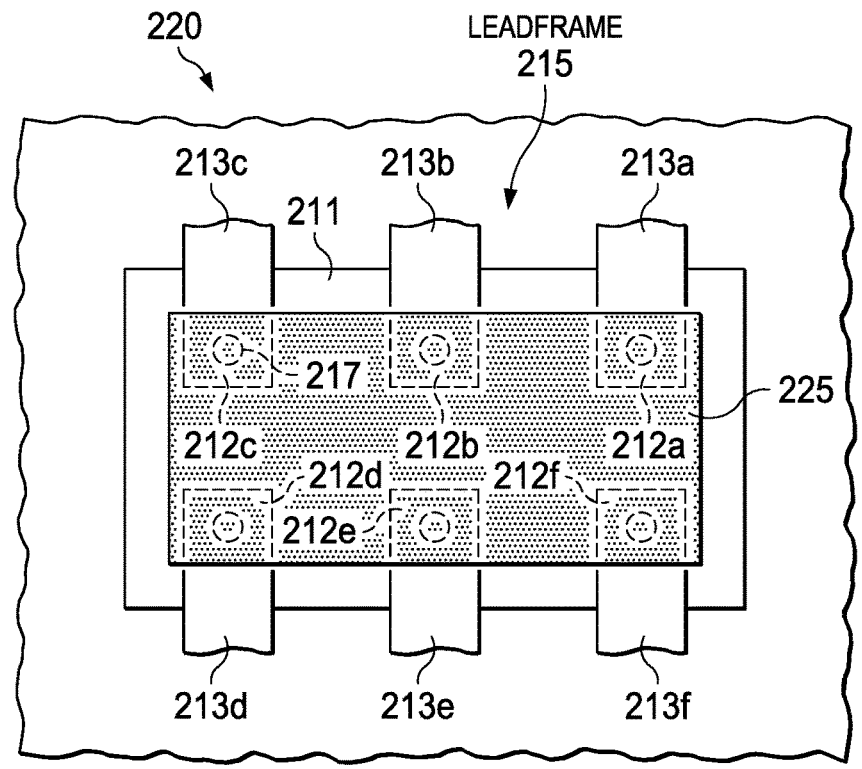
Figure 2C:
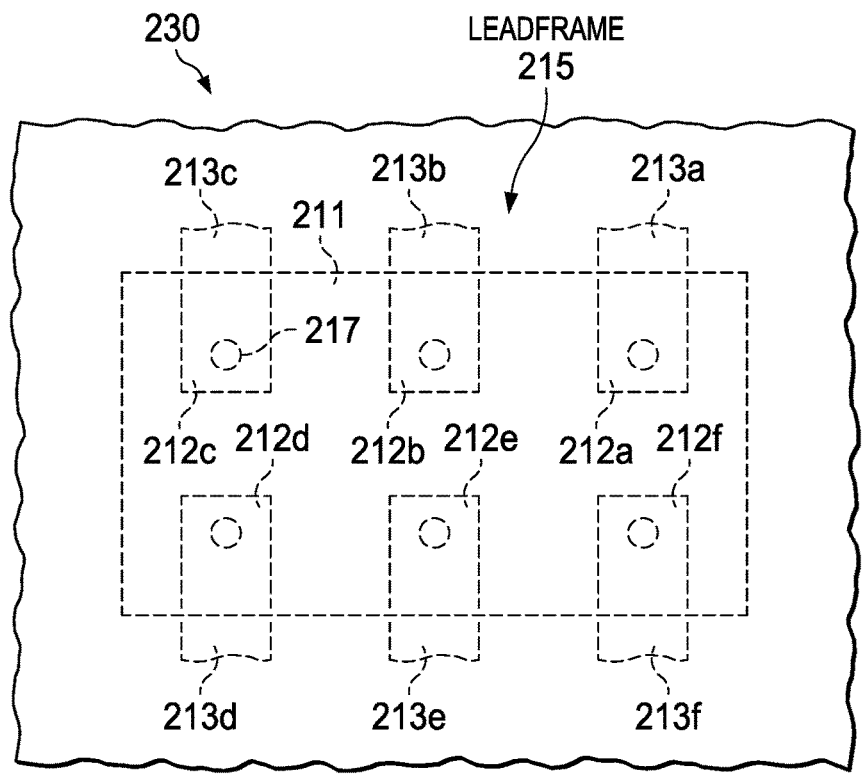
Figure 2D:
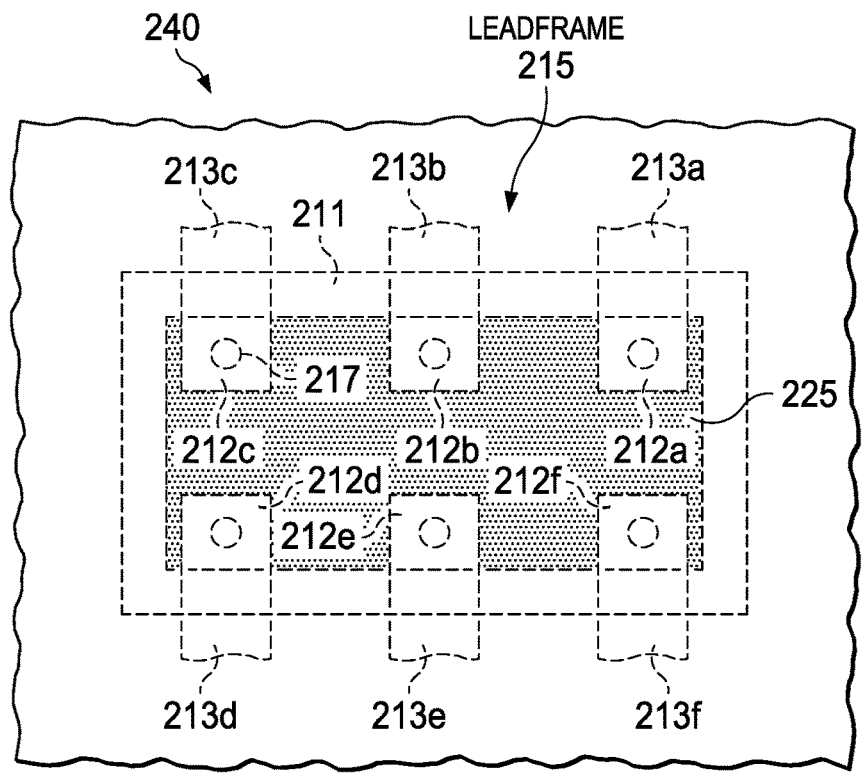

FIG. 2B shows a top view of the in-process package 220 with the die 225 shown as a shaded box now mounted face down onto the internal leadfingers 212 of the leadframe 215. FIG. 2C shows bottom view of the in-process package 230 without the die 225. The partially-etched landing sites of the leadfingers 212 are indicated as imaginary lines in the leadfingers 212 to show the landing sites are not through-holes. FIG. 2D shows a bottom view of the in-process package 240 with the die mounted on the leadfingers 212 shown. The bumps on the die 225 correspond in location to the landing sites of the leadfingers 212 indicated as imaginary lines.

Figure 2E:
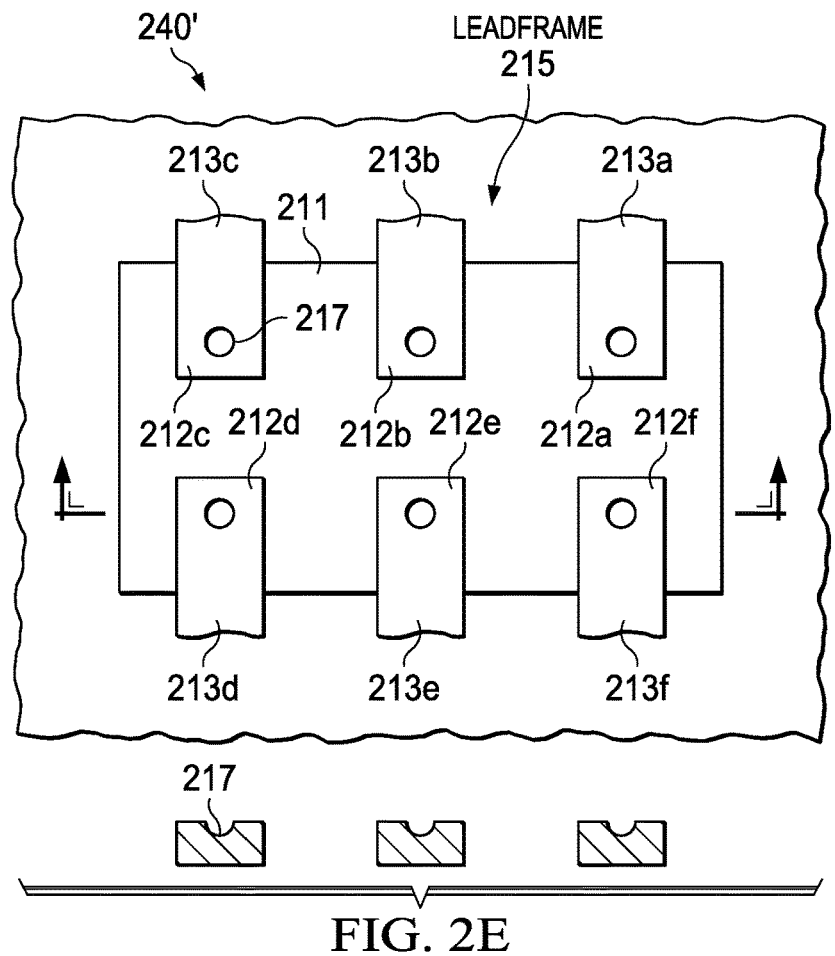

FIG. 2E shows a direction of cross section and side view (below) of a section of the (three) leadfingers 212d, 212e, 212f shown of the in-process package shown as 240' demonstrating how the landing sites of the leadfingers appear after cross-sectioning. Note the partially-etched landing sites are shown as semi-circles being about half-etched is where the bumps on the die 225 will be connected to later.

Figure 2F:
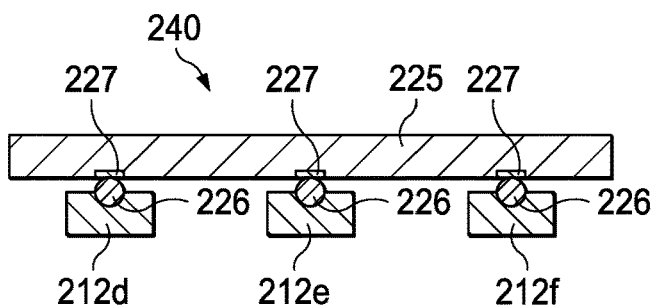
Figure 2G:
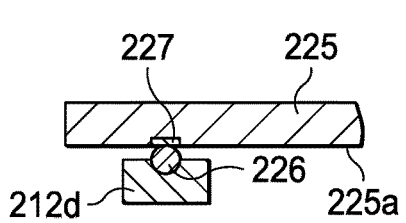
Figure 2H:
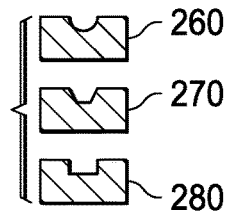

FIG. 2F shows side view of leadfingers of the in-process package 240 with the die 225 shown mounted so that the bumps 226 on the bond pads 227 of the die 225 are within the landing sites of the internal leadfingers 212. FIG. 2G is an expanded cross section view showing a single bump 226 (e.g., solder bump) on a bond pad 227 on the active top side surface 225a with functional circuitry of the die 225 connected to one of the partially-etched landing sites of the inner leadfinger 212d. FIG. 2H shows different example shape options for the partially-etched landing sites where bumps 226 on the die 225 will be connected being semi-circular 260, rectangular 270 and trapezoidal cross 280 in sectional shape. In one embodiment the landing sites a pre-filled solder filled, where the partially-etched landing sites serve as a "catch basin" for solder paste or flux which can be applied during a screen printing process to apply solder the—partially-etched landing sites before die attach.

Figure 3:
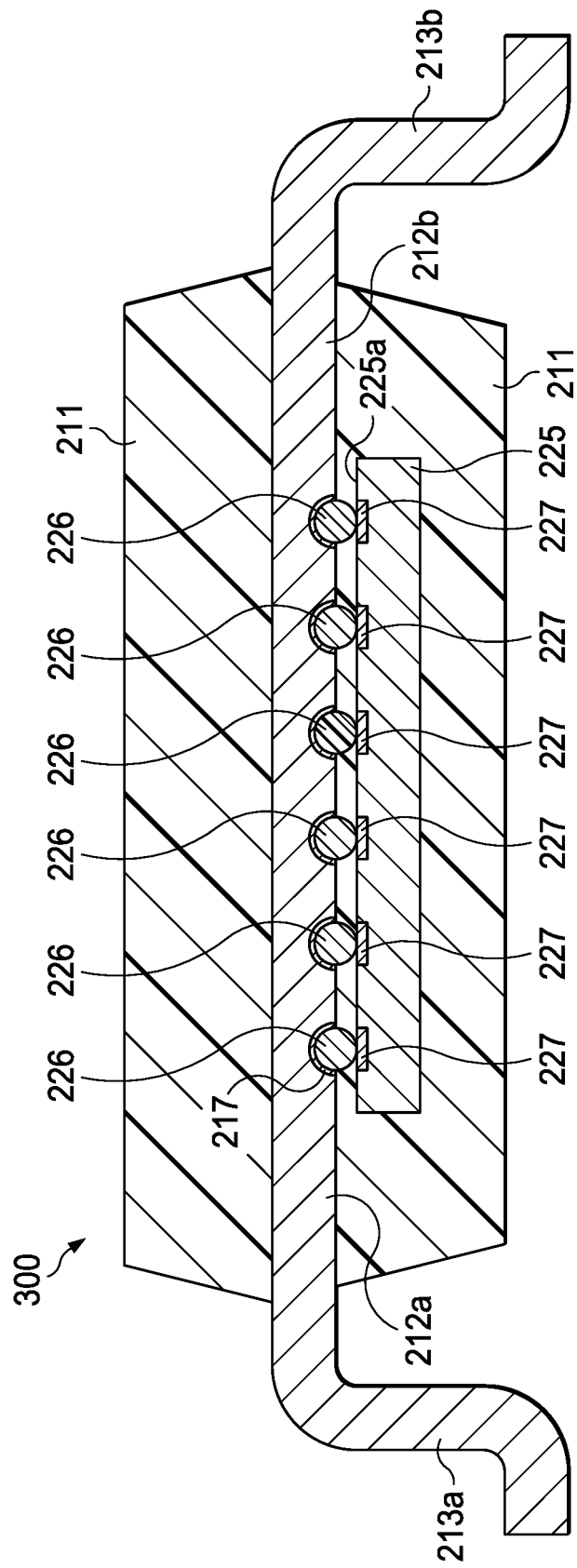
FIG. 3 is a side view depiction of an example flip-chip on leadframe leaded package where the leads of the leadframe include inner leadfinger portions that are all in a single common level (or plane) and include etched areas providing bump pads having partially-etched landing sites, according to an example embodiment.

FIG. 3 is a side view depiction of an example flip-chip on leadframe leaded package (leaded package) 300 where the leads of the leadframe include inner leadfinger portions 212a, 212b encapsulated by the mold material 211 that are all in a single common level (or plane) and include etched areas providing bump pads having partially-etched landing sites 217. A distal end of the bumps 226 on bond pads 227 on the active top side surface 225a of the die 225 are within and electrically coupling to the landing sites 217. The leads also include external lead portions 213a, 213b (beyond the mold material 211) connected to the inner leadfinger portion 212a, 212b extending out from the mold material 211 to provide the leaded package 300.

Figure 4A:
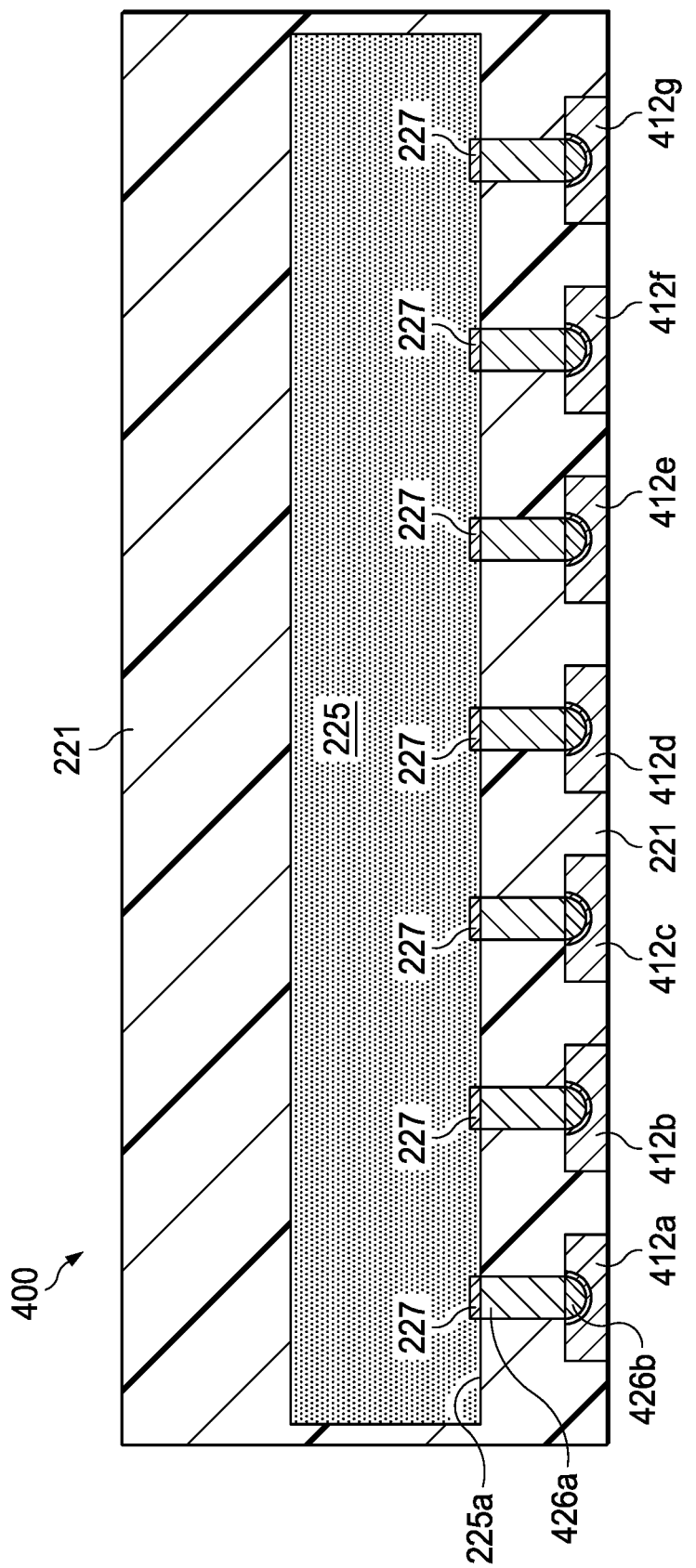
FIG. 4A is a side view depiction and FIG. 4B a front view of an example flip-chip on leadframe leadless package, according to an example embodiment.
Figure 4B:
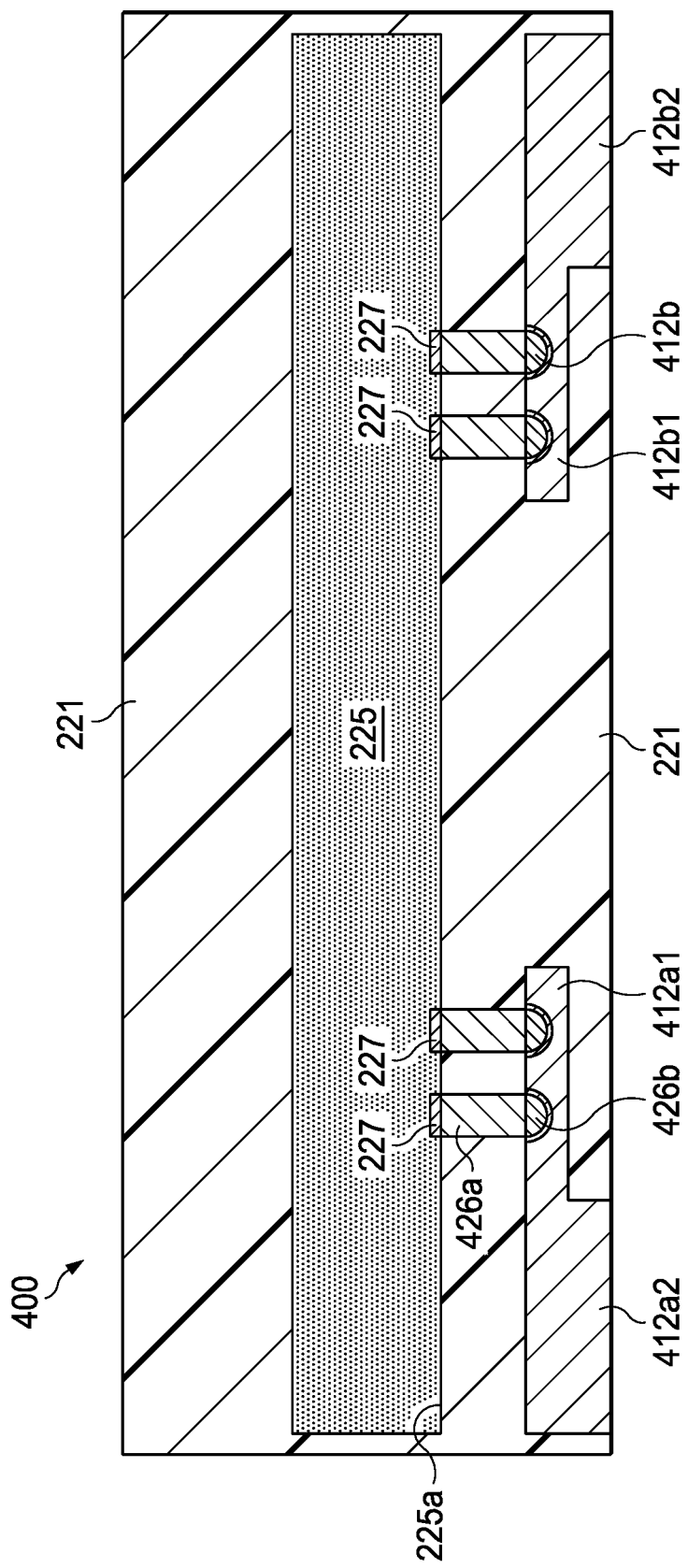

FIG. 4A is a side view depiction and FIG. 4B a front view of an example flip-chip on leadframe leadless package (leadless package) 400. The leads of the leadframe consist of inner leadfingers 412a, 412b, 412c, 412d, 412e, 412f and 412g as shown in FIG. 4A. FIG. 4B shows the leads in FIG. 4A (412a-f) as having partial-thickness innermost inner leadfinger portions 412a1, 412b1 providing landing regions having partially-etched areas receiving the distal end of the solder capped pillars (e.g., solder caps 426b on pillars 426a) and full thickness periphery inner leadfinger portions 412a2, 412b2. The active top side surface 225a of the die 225 includes solder caps 426b (e.g., SnAg) on the distal end of pillars 426a (e.g., copper or gold pillars) that are on bond pads 227. The full thickness periphery inner leadfinger portions 412a2, 412b2 on the bottom of the leadless package 400 are exposed from the mold material 211 to allowing bonding thereto.

Disclosed embodiments can be used to form a variety of different semiconductor integrated circuit (IC) devices and related products. The assembly can comprise single semiconductor die or multiple semiconductor die, such as PoP configurations comprising a plurality of stacked semiconductor die. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. An integrated circuit (IC) package, comprising:
   a semiconductor die;
   a lead frame including a plurality of leads, each of the plurality of leads having a concave portion with a semi-circular cross sectional shape, the semiconductor die electrically coupled to at least one of the plurality of leads;
   a metal alloy on the concave portion;
   a solder cap in the concave portion, a first surface of the solder cap coplanar with a first surface of the each of the plurality of leads; and
   mold material covering portions of the semiconductor die and the plurality of leads, wherein a second surface of each of the plurality of leads, opposite to the first surface, is coplanar with a surface of the mold material.

2. The IC package of claim 1, wherein each of the plurality of leads includes a landing site having the concave portion.

3. The IC package of claim 2, wherein:
   the semiconductor die includes an active surface with functional circuitry including bond pads thereon; and
   a metal pillar on the solder cap electrically connects the at least one lead to the semiconductor die.

4. The IC package of claim 3, wherein the active surface faces the concave portion.

5. The IC package of claim 3, wherein area of each of the landing sites is greater than an area of the metal pillar by a factor of 1.1 to 1.5.

6. The IC package of claim 1, wherein the lead frame is of a copper or a copper alloy.

7. The IC package of claim 1, wherein the second surface of each of the plurality of leads is exposed from the IC package.

8. An integrated circuit (IC) package, comprising:
   a semiconductor die;
   a lead frame including a plurality of leads, each of the plurality of leads including a concave portion with a semi-circular cross sectional shape, the semiconductor die electrically coupled to at least one of the plurality of leads, and each of the plurality of leads including substantially vertical side walls;
   a solder cap in the concave portion, a first surface of the solder cap substantially coplanar with a first surface of the each of the plurality of leads;
   a metal pillar on the solder cap that electrically connects the at least one lead of the plurality of leads to the semiconductor die; and
   mold material covering portions of the semiconductor die and the plurality of leads, wherein a second surface of each of the plurality of leads, opposite to the first surface, is coplanar with a surface of the mold material.

9. The IC package of claim 8 further comprising a metal alloy on the concave portion.

10. The IC package of claim 8, wherein each of the plurality of leads includes a landing site having the concave portion.

11. The IC package of claim 10, wherein the metal pillar is aligned with the landing site.

12. The IC package of claim 8, wherein the lead frame is of a copper or a copper alloy.

13. The IC package of claim 8, wherein the semiconductor die includes an active surface with functional circuitry including bond pads thereon, and wherein the active surface faces the concave portion.

* * * * *